United States Patent [19]

Friz

[11] Patent Number: 4,990,854
[45] Date of Patent: Feb. 5, 1991

[54] PROCESS AND DEVICE FOR AUTOMATICALLY DETECTING THE RESPONSE VOLTAGE OF AN ELECTROMAGNETIC COMPONENT, IN PARTICULAR AN ELECTROVALVE

[75] Inventor: Eckehart Friz, Ebersbach, Fed. Rep. of Germany

[73] Assignee: Robert Bosch GmbH, Stuttgart, Fed. Rep. of Germany

[21] Appl. No.: 348,666

[22] PCT Filed: Sep. 12, 1987

[86] PCT No.: PCT/DE87/00416
§ 371 Date: Mar. 28, 1989
§ 102(e) Date: Mar. 28, 1989

[87] PCT Pub. No.: WO88/02491
PCT Pub. Date: Apr. 7, 1988

[30] Foreign Application Priority Data

Sep. 30, 1986 [DE] Fed. Rep. of Germany ....... 3633113

[51] Int. Cl.$^5$ ............................................ G01R 31/02
[52] U.S. Cl. .................................... 324/418; 324/423; 340/644
[58] Field of Search ................. 324/418, 423; 340/644

[56] References Cited

U.S. PATENT DOCUMENTS 4,205,307  5/1980  Liermann et al. ................. 340/644

FOREIGN PATENT DOCUMENTS

| 2704289 | 8/1978 | Fed. Rep. of Germany | 324/418 |
| 522566 | 7/1976 | U.S.S.R. | 324/418 |
| 661443 | 5/1979 | U.S.S.R. | 324/423 |
| 748354 | 7/1980 | U.S.S.R. | 324/418 |
| 752235 | 7/1980 | U.S.S.R. | 324/418 |
| 1014062 | 4/1983 | U.S.S.R. | 324/418 |

Primary Examiner—Gerard R. Strecker
Assistant Examiner—Maura K. Regan
Attorney, Agent, or Firm—Michael J. Striker

[57] ABSTRACT

In a process for automatically detecting the response of an electromagnetic valve, in particular an electrovalve, an increasing testing voltage is applied to the valve and the instantaneous testing voltage at which the electromagnetic valve responds is fixed and indicated in that the monetary decrease of the current flowing through the valve is detected and utilized for fixing and indicating the instantaneous value of the testing voltage. A device for automatically detecting the response voltage of the electromagnetic valve includes an indicating device (8) which is controllable in such a way that it indicates and fixes the value of the testing voltage applied to the electromagnetic valve as soon as the valve responds to the testing voltage.

4 Claims, 3 Drawing Sheets

PROCESS AND DEVICE FOR AUTOMATICALLY DETECTING THE RESPONSE VOLTAGE OF AN ELECTROMAGNETIC COMPONENT, IN PARTICULAR AN ELECTROVALVE

The invention is directed to a process as well as a device for automatically detecting the response voltage of an electromagnetic component, in particular an electrovalve. The function of electromagnetic components, particularly electrovalves, e.g. in injection systems and anti-lock systems of brake systems, must often be tested e.g. in motor vehicles. In known processes and devices which are used for this purpose (DE-OS 23 52 493; DE-OS 22 51 472), the fact that the movement of a magnet armature in the coil of an electrovalve causes a change in inductance is evaluated. As a result of this, the strength of current of the current flowing through the coil of the electrovalve decreases during the movement of the magnet armature. This change of the strength of current is determined by means of a differential element and utilized for testing the functioning of the electrovalve. If a determined drop in the strength of current is detected by means of the differential element, this means that the magnet armature of the valve has moved; otherwise, there is an error. In the known processes and devices, however, the function testing is restricted to whether or not the magnet armature of the electrovalve moves at all.

ADVANTAGES OF THE INVENTION

In contrast, the process, according to the invention, as well as the device for implementing the process, have the advantage that the operating behavior of an electromagnetic component, particularly an electrovalve, can be exactly determined. For this purpose, the minimum response voltage of the component is detected automatically in that an increasing testing voltage is applied to the electromagnetic component and the testing voltage at which the electromagnetic component responds is determined and indicated in that the decrease of current flowing through the component which occurs during the response of the component is detected and utilized for fixing and indicating the instantaneous value of the testing voltage. In this way, it can not only be determined whether or not the electromagnetic component reacts at all, i.e. whether or not the electrovalve attracts, but also the minimum voltage at which it responds can be determined. Accordingly, not only can stuck electrovalves be detected, but also electrovalves which are slow to react.

The process and device, according to the invention, enable a simple and accurate determination of the response voltage without the need to dismantle the electromagnetic component. Errors caused by operating personnel are eliminated.

DRAWING

The invention is explained in more detail below by means of the drawings showing the embodiment examples.

DESCRIPTION OF THE EMBODIMENT EXAMPLES

Figure 1:
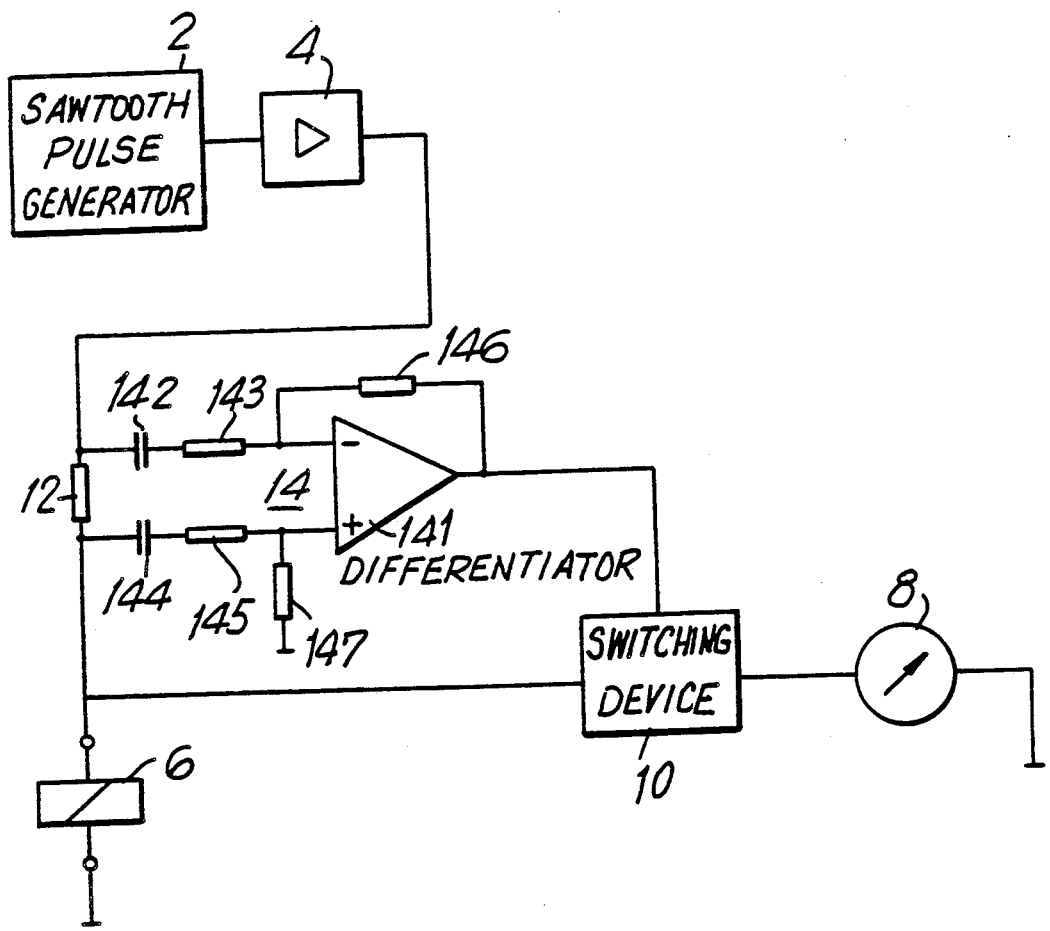
FIG. 1 shows a basic circuit diagram of the device of the invention.

FIG. 1 shows a basic circuit serving to illustrate the operation of the device and process according to the invention.

A testing voltage is produced by a voltage source, in this case a sawtooth oscillator 2, which testing voltage is amplified by an amplifier 4 to a voltage suitable for actuating an electromagnetic component to be tested, only the actuating coil 6 of the latter being shown here. This voltage is applied to the coil 6 which is connected to ground on the other side. The testing voltage applied to the coil 6 can be indicated by an indicating device 8. A switching device 10 is provided in the line to the indicating device. 8.

The current flowing to the coil 6 of the component under test is directed through a precision resistor 12. The increasing voltage deep across the resistor 12 is measured by a differentiating arrangement 14 which comprises an operational amplifier 141. One side of the precision resistor 12 is connected with the inverting input of the operational amplifier 141 via a first differential capacitor 142 and a first resistor 143. The other side of the precision resistor 12 is connected via a second differential capacitor 144 and a second resistor 145 with the non-inverting input of the operational amplifier 141 which is counter-coupled via a third resistor 146. The non-inverting input of the operational amplifier 141 is grounded via a fourth resistor 147. The output of the differentiating arrangement 14 and the operational amplifier 141, respectively, is connected with the switching device 10.

The circuit according to FIG. 1 functions as follows: The coil 6 of the electromagnetic component to be tested, e.g. electromagnetic valve of a fuel injection system, is acted upon by the testing voltage which is generated by the sawtooth oscillator 2 and amplified by the amplifier 4 without needing to disconnect the valve. The minimum value of the testing voltage is e.g. zero, at any rate it must be less than the expected minimum response voltage of the electromagnetic component to be tested. The maximum testing voltage corresponds e.g. to the maximum operating voltage of the test piece. The current flowing through the coil 6, and accordingly through the precision resistor 12, causes a voltage drop at the precision resistor 12 which is measured by the differentiating arrangement 14. Because of the increasing voltage, the iron core or magnet armature of the electrovalve finally moves, providing the electrovalve is intact. This movement changes the inductance of the coil 6 in which, moreover, a voltage is induced. The current flow through the coil 6 and the precision resistor 12 is accordingly reduced. The derivation of the current or voltage at the resistor 12 carried out with respect to time in the differentiating arrangement 14 then changes sign for a brief period of time. This change is sent as a control signal to the switching device 10.

Whereas, in a first embodiment of the circuit, the indicating device 8 indicated the testing voltage applied to the coil 6 in a continuous manner up to this point, the normally closed switching device 10 in response to the control signal interrupts t between the coil 6 and the indicating arrangement 8. The indicating arrangement now display the last instantaneous value of the testing voltage applied to the coil 6, since a further increase of the testing voltage cannot be indicated due to the interruption of the line to the indicating device 8 effected by the switching device 10. The indicating device 8 is designed in such a way that the last instantaneous value of the testing voltage before the interruption of the line remains indicated and the indication is not reset to zero.

The change in the current flow due to the response of the electrovalve can also be evaluated for the response of the switching device 10 in a second embodiment of the circuit in such a way that the indicating device 8 only indicates the testing voltage applied to the test piece when the test piece responds. The switching device 10 is constructed in such a way that it briefly produces a connection to the indicating device 8 at the moment of response of the test piece; however, a further increase of the testing voltage is no longer indicated. The operating personnel can then not read any indication from the indicating device 8 while the testing voltage continues to increase without the test piece having responded. The possibility of a reading error is accordingly reduced.

But the process can also be implemented in such a way that the operating personnel testing an electromagnetic component can choose freely between the two controlling possibilities of the indicating device 8.

Figure 2:
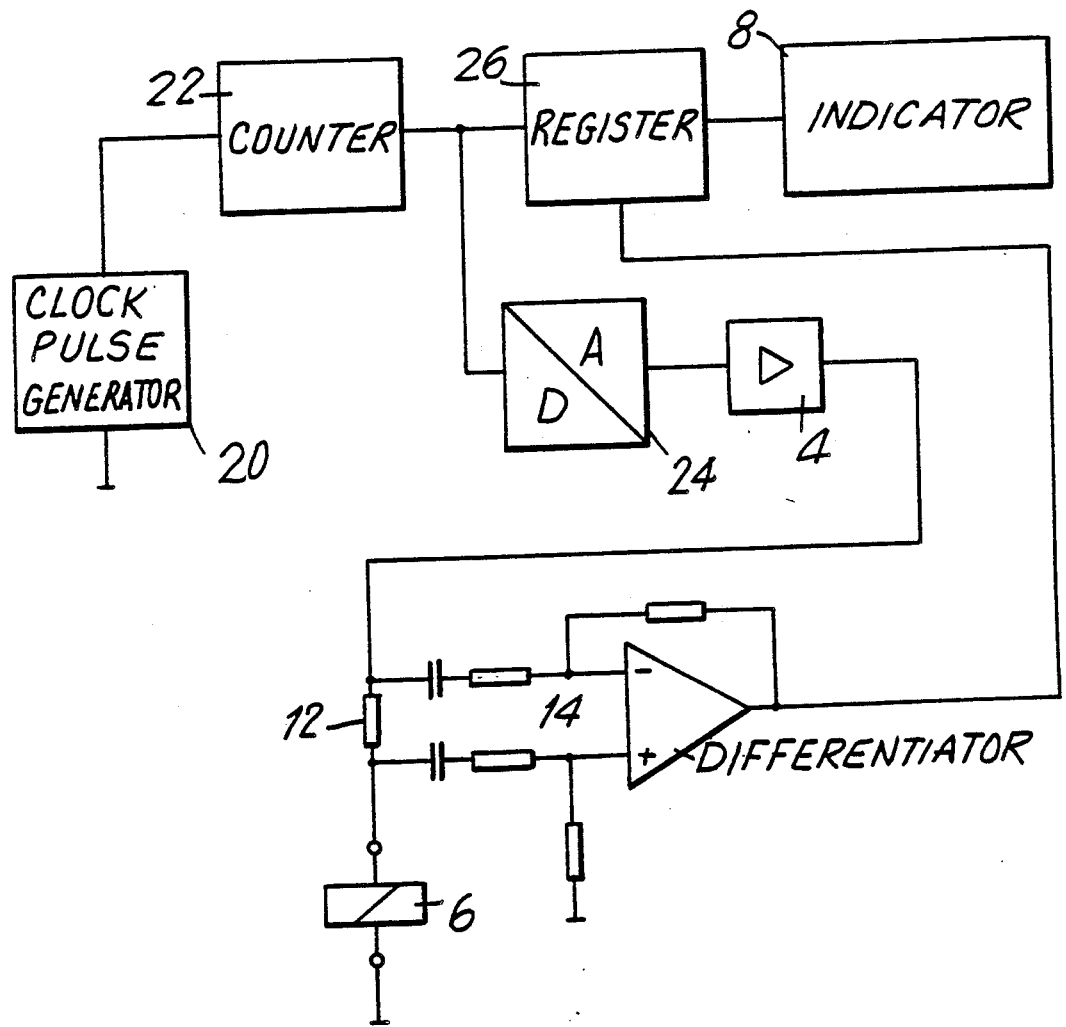
FIG. 2 shows an embodiment example of the device, according to FIG. 1.

FIG. 2 shows an embodiment example of the device shown in FIG. 1, wherein the same parts are provided with the same reference numbers.

A square-wave or clock generator 20 controls a counter 22 whose output signal is transmitted to a digital-to-analog convertor 24 (henceforth, D/A convertor) on the one hand and to a register 26 serving as storage on the other hand. An indicating device 8 is connected with the register 26. The signals of the counter 22 are converted in the D/A converter 24 and a voltage is generated which is amplified by an amplifier 4 to a value suitable for an electromagnetic component to be tested. In this case, also, only the coil 6 of the test piece is shown.

As in FIG. 1, the current flowing through the coil is directed through a precision resistor 12 and the voltage drop cross at the latter is differentiated by a differentiating arrangement 14 whose output is connected with the register 26, the differentiating arrangement 14 being shown in an accurate manner by means of FIG. 1.

The response voltage of the electromagnetic component is determined in the following manner with the embodiment example of the circuit according to FIG. 2:

At the commencement of the measurement, the counter 22 and the register 26 are reset, so that the indicating device 8 does not indicate voltage and the coil 6 of the test piece is without voltage.

A sawtooth voltage which is approximated by a staircase-type voltage serves as testing voltage in this instance and is generated by means of the clock generator 20 controlling the counter 22. The state of the counter 22, which is constructed e.g. as a binary counter, is increased by means of the entering clock pulses of the clock generator 20. The output signal of the D/A converter 24 controlled by the counter 22 is accordingly also increased in a stepwise manner. The D/A converter 24 and the amplifier 4 arranged after the latter are designed in such a way, for example, that the voltage applied to the coil 6 of the test piece is increased by 0.1 V at every clock pulse of the clock generator 22. But the circuit can also be designed in such a way that the operating personnel can adjust the voltage increase occurring per clock cycle in a stepwise or free manner.

Because of the stepwise voltage increase, the magnet armature of the coil 6 finally moves, so that there occurs the change in inductance discussed above with the aid of FIG. 1, which change in inductance is detected by the differentiating arrangement 14 as a change in the current flow through the precision resistor 12 and as change in voltage.

Due to the change in sign of voltage determined by the differentiating arrangement 14, a control signal is generated which is fed to the register 26. The register 26, which is constructed as a storage, evaluates the counter state of the counter 22 and determines from this the testing voltage applied to the coil 6 of the electromagnetic component. This voltage can be indicated by means of the indicating device 8 connected with the register 26.

When a control signal of the differentiating arrangement 14 arrives at the register 26, the testing voltage applied during the response of the electromagnetic component is indicated and fixed on the indicating device 8.

The circuit can also be constructed in such a way that the operating personnel can also read the testing voltage on the indicating device 8 already during the increase.

After reaching the maximum testing voltage the circuit is reset, i.e. the indication of the response voltage is canceled, and the testing voltage returns to the initial value. The process then repeats itself. The response behavior of the test piece is accordingly tested repeatedly and random results are prevented by means of comparing a plurality of indicated values at which the test piece responds.

Figure 3:
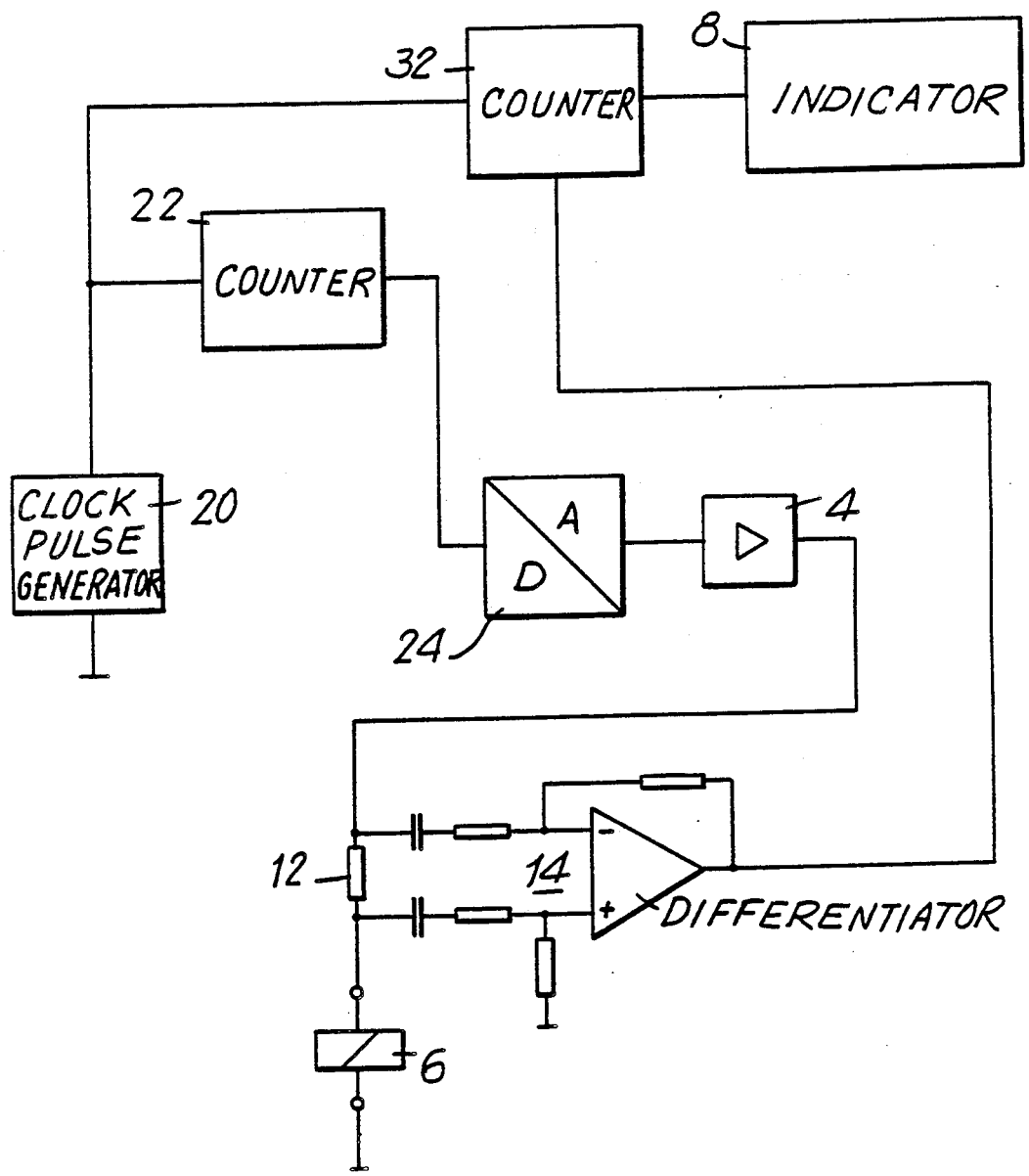
FIG. 3 shows another embodiment example of the device according to FIG. 1.

FIG. 3 shows another embodiment example of the circuit shown in FIG. 1, wherein the same parts again have the same reference numbers.

A square-wave or clock generator 20 supplies counting pulses to a first counter 22, which is connected with a digital-to-analog converter 24 (henceforth, D/A converter), and a second counter 32 connected with an indicating device 8. A testing voltage which is suitable for an electromagnetic component is produced from the output signal of the first counter 22, which is constructed as a binary counter, by means of the D/A converter 24 and an amplifier 4. In this case, also, only coil 6 of the component to be tested is shown. As already explained by means of FIGS. 1 and 2, the current guided through the coil 6 flows through the precision resistor 12. The voltage drop across the resistor 12 is detected and evaluated by a differentiating arrangement 14 explained accurately in FIG. 1. The output signal of the differentiating arrangement 14 is transmitted to the second counter 32.

At the commencement of the measurement the two counters 22 and 32 are reset so that the indication stands at zero and the test piece is without voltage. The production of the testing voltage for the coil 6 of the electromagnetic component is identical o that in the circuit explained with the aid of FIG. 2. The second counter 32 is constructed as a multiple-stage decimal counter and controls the numerical display of the indicating device 8.

Since both counters are controlled by the same clock generator 20, they run synchronously. When it is determined in the manner described above by means of the differentiating arrangement 14 that the electromagnetic component responds, the second counter 32 is controlled by the output signal of the differentiating arrangement 14. This counter is separated from further clock pulses e.g. by means of setting a non-illustrated flip-flop arranged in the connecting line between the clock-generator 20 and the second counter 32, and fixes the testing voltage applied during the response of the electrovalve. This voltage is indicated by the indicating device 8. Even if the testing voltage is further increased, the indication remains unchanged.

The circuit can be constructed in such a way that only the testing voltage at which the electrovalve has attracted is indicated or in such a way that the increasing testing voltage is also already readable. The operating personnel can monitor the testing process, that is, the increasing voltage.

After reaching the maximum testing voltage, both counters 22 and 32 are reset, i.e. the indication is canceled and the testing voltage is rest to the initial value. The described process is then repeated.

The components mentioned in the drawing, such as counters, register and differentiating arrangement, can be integrated in a circuit, e.g. in a motor vehicle diagnostic device or in a fuel injection pump test stand, and the process can be part of a computer program for testing the functioning of a motor vehicle or an injection pump.

It must also be mentioned that the process and device, according to the invention, can be utilized for testing diverse electromagnetic components, e.g. also electromagnetic relays, without departing from the framework of the invention.

I claim:

1. Process for automatically detecting the response voltage of an electromagnetic valve having a coil connected in series with a measuring resistor, comprising the steps of
    applying an increasing testing voltage across the series connection of the measuring resistor and the coil of the electromagnetic valve;
    measuring the change of the voltage drop across the coil of the electromagnetic valve and indicating the instantaneous measured voltage value;
    differentiating the voltage drop across the measuring resistor to produce a switching signal when current flowing through the series connection decrease due to the response of the electromagnetic valve;
    stopping by means of the switching signal the indication of the instantaneous measured voltage value;
    said increasing testing voltage being a staircase-shaped voltage produced by controlling a digital-to-analog converter by a free-running binary counter; and
    the instantaneous measured voltage being indicated by means of an indicating device which is controlled by means of a second counter.

2. Process according to claim 1, characterized in that a multiple-stage decimal counter is used as said second counter.

3. Process for automatically detecting the response voltage of an electromagnetic valve having a coil connected in series with a measuring resistor, comprising the steps of
    applying an increasing testing voltage across the series connection of the measuring resistor and the coil of the electromagnetic valve;
    measuring the change of the voltage drop across the coil of the electromagnetic valve and indicating the instantaneous measured voltage value;
    differentiating the voltage drop across the measuring resistor to produce a switching signal when current flowing through the series connection decreases due to the response of the electromagnetic valve;
    stopping by means of the switching signal the indication of the instantaneous measured voltage value;
    the increasing testing voltage being a staircase-shaped voltage produced by controlling a digital-to-analog converter by a free-running binary counter; and
    the switching signal being a pulse produced during the response of the electromagnetic valve and being applied to a second counter to stop the indication of the instantaneous measured voltage independently of the output of the digital-to-analog converter.

4. Device for automatically detecting the response voltage of an electromagnetic valve having a coil connected in series with a measuring resistor, comprising
    means for applying an increasing testing voltage across the series connection of the measuring resistor and the coil of the electromagnetic valve;
    means for measuring the change of the voltage drop across the coil of the electromagnetic valve and indicating the instantaneous measured voltage value;
    means for differentiating the voltage drop across the measuring resistor to produce a switching signal when current flowing through the series connection decreases due to the response to the electromagnetic valve;
    means for stopping by means of the switching signal the indication of the instantaneous measured voltage value;
    the measuring means including an indicating device which is designed in such a way that it indicates and fixed the indication of a voltage value applied thereto; and
    the stopping means including a switching device for connecting the instantaneous measured voltage to the indicating device and disconnecting the same at the instant at which the electromagnetic valve (6) responds.

* * * * *